United States Patent
Meyer et al.

(10) Patent No.: US 6,706,201 B1
(45) Date of Patent: Mar. 16, 2004

(54) METHOD FOR PRODUCING METALLIZED SUBSTRATE MATERIALS

(75) Inventors: Heinrich Meyer, Berlin (DE); Ralf Schulz, Hohen Neuendorf (DE); Roland Heinz, Northeim (DE); Eckart Klusmann, Troisdorf (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 09/673,760

(22) PCT Filed: Apr. 15, 1999

(86) PCT No.: PCT/DE99/01159

§ 371 (c)(1),
(2), (4) Date: Dec. 21, 2000

(87) PCT Pub. No.: WO99/54525

PCT Pub. Date: Oct. 28, 1999

(30) Foreign Application Priority Data

Apr. 20, 1998 (DE) ......................................... 198 17 388

(51) Int. Cl.$^7$ ................................................. C23C 4/02
(52) U.S. Cl. .............................. 216/12; 216/13; 216/37; 216/58; 216/67; 427/456; 427/534; 427/537
(58) Field of Search .............................. 216/12, 13, 37, 216/58, 67; 427/456, 534, 537

(56) References Cited

U.S. PATENT DOCUMENTS

| 3,294,059 A | 12/1966 | Barnes et al. .............. 118/49.5 |
| 4,717,587 A | 1/1988 | Suhr et al. ................... 427/39 |
| 4,990,363 A | 2/1991 | Suhr et al. ................... 427/40 |
| 5,798,148 A | * 8/1998 | Thomas et al. ............. 427/535 |

FOREIGN PATENT DOCUMENTS

| DE | 35 10 982 A1 | 9/1986 |
| DE | 35 12 196 A1 | 10/1986 |
| DE | 37 44 062 A1 | 7/1989 |
| DE | 38 06 587 A1 | 9/1989 |
| DE | PCT/DE95/01501 | 10/1995 |
| DE | 44 38 791 A1 | 4/1996 |

OTHER PUBLICATIONS

"Thin Palladium Films Prepared by Metal–Organic Plasma–Enhanced Chemical Vapor Deposition", Thin Solid Films, Band 157 (1988), p. 81–86.

* cited by examiner

Primary Examiner—Allan Olsen
(74) Attorney, Agent, or Firm—Paul & Paul

(57) ABSTRACT

For manufacturing substrate materials which are needed for the manufacture of electrical circuit carriers, methods are known in which metal layers are applied to a dielectric substrate by means of a glow discharge process and thereafter additional metal layers are applied by means of electroplating processes. These methods however are not suitable for the manufacture of substrate materials which are suitable for high frequency applications in the gigahertz range. The invention starts from the previously-mentioned methods and solves the described problem through the use of fluoropolymers and through coating of these materials by means of a glow discharge process with nickel, since by this means even very smooth surfaces of the substrate can be securely coated. The metallised materials can be coated with additional metal layers from electroless or electrolytic deposition baths.

9 Claims, No Drawings

METHOD FOR PRODUCING METALLIZED SUBSTRATE MATERIALS

The invention relates to a method of manufacturing metallised substrate materials which are suitable for use in the manufacture of electrical circuit carriers which may be used in the gigahertz range (Ghz).

For the manufacture of high-density electrical circuits, circuit carriers which have a plurality of conductor track levels are used. These circuits serve to connect to one another, besides so-called passive components, for example resistors and capacitors, also active components, i.e. integrated semiconductor circuits, in order to construct an electrical circuit. In recent times, the active components have been fitted even without housings directly onto the circuit carriers, for example by the semiconductor circuits being bonded with bond wires directly or via so-called TAB (tape automated bonding) connectors to the connection points. By this means, higher conductor track densities can be achieved than with housed semiconductor circuits, since the housings take up considerable space on the circuit carriers, which space cannot be used for the circuit.

For some time now, circuit carriers of this sort for new types of semiconductor components have been used, for example of multichip modules (MCM). These components are distinguished by a higher functional density than traditional active components.

Higher and higher requirements are made of the techniques for manufacturing the circuit carriers for these components. On the one hand narrower and narrower electrical conductor tracks are formed in smaller and smaller distances from one another. On the other hand, components are also needed for applications with increasing thermal load on account of the rising complexity of the wiring density. A further requirement consists in manufacturing components with particularly high, switching frequencies. The standard clock frequencies in office computers, for example, are in the region of several hundred megahertz (MHz). In the meantime, clock frequencies in the semiconductor circuits of more than 1 GHz are aimed at, the intention being that the electrical signals should be transmitted without noticeable losses and distortion of the signal form. In overcoming the problems arising here, the materials for the manufacture of the circuit carriers play an essential role, since their dielectric constant $\epsilon$ and, the dielectric loss factor (tan $\delta$) largely determine the utilisable frequency range.

For the manufacture of the circuit carriers, for example multichip modules, amongst other things known manufacturing methods from printed circuit board technology are used. For example, dielectric substrates made of an epoxy resin material which is reinforced with glass fiber mats can be used for this purpose. On the outer sides of these laminates, copper layers are normally provided, from which the conductor tracks are formed by etching and if necessary by electrolytic metal deposition processes. Materials of this kind are very suitable also for the manufacture of multilayer circuit carriers, by a plurality of laminates provided with a circuit pattern being connected to one another.

For the manufacture of particularly high-density circuit patterns, dielectric substrates provided without outer copper layers are preferably used. The copper layers required for producing the conductor tracks are applied to the laminates by means of metallisation processes. One of the possible manufacturing methods consists in forming metal layers by decomposing volatile metal compounds in a glow discharge. With this method, strongly bonded metal layers can be formed on the substrate surfaces.

For example, in DE P 35 10 982 A1 a process for manufacturing electrically conductive structures, e.g. conductor tracks, on non-conductors is described, in which a metallic film is deposited by the decomposition of organometallic compounds in a glow discharge zone. As non-conductors, ceramics, for example aluminium oxide and silicone oxide ceramics, glass, synthetics, for example polyimide foil and composite materials are mentioned. As decomposable compounds, organic copper, organic tin and organic palladium compounds are mentioned. The use of nickel tetracarbonyl and molybdenum hexacarbonyl is described as unutilisable on account of the high toxicity of these compounds.

Furthermore, in DE P 38 06 587 A1 a method for manufacturing securely adhering metal structures on polyimide surfaces is described. To this end, organometallic compounds are formed in a glow discharge forming a metallic film. Metals of the I, and VIII, subgroup of the periodic system can be used. Compounds of palladium, platinum, gold, copper, ruthenium and iridium are expressly proposed. The metal layers, for example of palladium, are then coated with additional metal layers, for example with copper or nickel, these additional layers being formed in an electroless metallisation bath. To improve the adhesion of the metal layers to the dielectric, the latter is cleaned and etched by means of suitable plasma processes before the formation of the first metal layers.

In DE P 44 38 791 A1 a further method for depositing metal layers on polyimide surfaces is described. Palladium, platinum, copper, gold and silver are mentioned as metals which may be deposited in the glow discharge zone. In contrast to the previously-described process, additional metal layers are formed in an electroless metallisation bath adjusted either acid or neutral. By this means, a sufficiently high adhesive strength can be maintained on the polyimide material even during and after thermal stressing of the polymer/metal bond.

In WO 9612051 A1 a method for depositing metal layers on polyimide surfaces is also described in which the first metal layer is produced through decomposition of volatile metal compounds by means of a glow discharge process. As metals which may be deposited, in particular palladium, copper, gold and platinum are mentioned as well as other metals which can form a catalytic metal layer for the subsequent electroless metal deposition. The metal layers are here formed in the presence of a gas mixture which contains inert gases and oxygen. This provides a solution to the problem that the metal layers formed, after a conventionally undertaken tempering treatment for consolidating the layers on the substrate with aqueous alkaline solutions, for example a solution to develop photoresist layers applied to the metal layers, are brought into contact. In the previously known methods, the adhesive strength of the metal layers sank abruptly with treatment of this kind to very low values. Here the metal layers detached themselves completely from the polyimide surfaces in individual cases.

A method for coating polyimide surfaces is also described in the scientific article "Thin Palladium Films Prepared by Metal-Organic Plasma-Enhanced Chemical Vapour Deposition" in Thin Solid Films, Volume 157 (1988), pages 81–86, by E. Feurer and H. Suhr. In order to manufacture palladium layers which are as pure as possible, the depositing and subsequent treatment conditions were varied. A coating in a pure argon plasma led to layers contaminated with carbon. Through subsequent oxygen treatment in plasma, a very pure palladium layer could be obtained. By further after-treatment in a hydrogen plasma, the metal content of the layer was not substantially increased. By means of a different manufacturing method through deposition from an oxygen plasma, it was in fact possible to obtain a layer free of carbon. However, the layer consisted not of palladium but of palladium oxide. The oxide layer was converted into pure palladium by subsequent treatment in a hydrogen plasma.

It has been shown that polyimide admittedly has excellent thermal stability in relation to traditional epoxy resin materials which are usually used for the manufacture of printed circuit boards. However the dielectric properties of this polymer ($\epsilon$, tan $\delta$) is not good enough for many applications, such that high frequency applications in the GHz range cannot be realised in every case with circuit carriers manufactured from this material. Moreover the polymer absorbs water through the electroplating treatment in which aqueous solutions are used for coating. In this way, too, the dielectric properties are impaired. The water absorption is particularly pronounced with the use of alkaline solutions. Moreover it is also possible that there is no sufficiently strong bond between the metal layers and the basic material.

For this reason, attempts were also made to coat securely with metal materials which were better suited to the manufacture of high-density circuit carriers. In DE P 37 44 062 A1, a method for coating fluoropolymers is disclosed. In this case too, the basic material is first cleaned and etched in a glow discharge zone and then a first metal layer is deposited in a glow discharge zone through the decomposition of organometallic compounds, for example palladium, platinum, gold and copper compounds. In turn, additional metal layers can be deposited onto this metal layer from an electroless copper or nickel bath.

The known methods for forming strongly bonded and sufficiently thick metal layers on polymer carrier materials start from forming a first metal layer in the glow discharge zone, and producing a second metal layer upon the first by electroplating means, an electroless coating method being generally preferred in order not to be subject to any limitations in respect of the high electrical conductivity necessary for the electrolytic metal deposition of the first metal layer produced by means of a glow discharge process. For the electrolytic metal deposition, namely, relatively thick first metal layers would have to be formed in the glow discharge, for example 0.5 $\mu$m to 1 $\mu$m thick layers. For this purpose, a long coating time would have to be provided, such that the method would become too expensive on account of the high investment costs for the coating plant. For this reason, the first metal layer must have catalytic properties for the subsequent electroless coating. Reference is already made to this in WO 9612051 A1. Noble metals such as palladium, platinum, gold and copper are generally used for a catalytically effective coating.

It has moreover emerged that, with the known processes, in which the polymer basic material, to achieve sufficient adhesive strength, always has to be pre-treated first in a cleaning and etching process, in order to achieve sufficient cleaning of the surface and adhesive strength of the applied metal film, is not suitable for high frequency applications in the GHz range. The electrical characteristics obtained of the circuit carriers which may be manufactured by these methods did not satisfy the requirements in most cases.

For instance it is quoted in DE 37 44 062 A1, that the pre-treatment is carried out with a plasma etching process in order to clean and etch the surfaces. Preferably, for this purpose, reactive gases, e.g. oxygen or tetrafluoromethane-oxygen are added to the inert carrier gas. According to one example, a mixture of tetrafluoromethane and oxygen in the ratio of 1/3.5 can be used. However it has become apparent that the surfaces obtained with this etching process are very rough. The average peak-to-valley heights Ra lie in the $\mu$m range. Thus metallisations on surfaces of this kind are not suitable for the manufacture of circuit carriers to be used in the GHz range. The problem underlying the present invention consists therefore in avoiding the disadvantages of the known methods, and making available especially carrier materials securely coated with metal for the manufacture of circuit carriers which are suitable for high frequency applications in the GHz range.

The problem is solved by the method according to claim 1. Preferred embodiments of the invention are described in the sub claims. Preferred applications of the method are quoted in claims 10 and 11.

To solve the problem, fluoropolymers are used as carrier materials. For example, polytetrafluoro-ethylene (PTFE) is particularly well suited to such applications since it has a very low dielectric constant ($\epsilon$=2.1 at $10^8$ Hz, 22° C.).

In order to exploit the advantageous properties of this material, it has proved to be essential to coat smooth surfaces of the material with a strong bond. Too severeroughening on the other hand impairs the signal transmission and is moreover unsuitable for the finest conductor applications.

Generally, smooth surfaces are in fact less suitable for depositing metal securely onto same. For example strongly bonded metal layers can not be formed through an initially deposited palladium layer by means of the glow discharge method onto smooth dielectric surfaces of this kind and subsequent coating of this layer with a the copper layer by means of an electroless metallisation process. This only succeeds when known methods are used if there is very severe roughening. For in general, fluoropolymers only form very weak interactions with other materials, such that the adhesive strength of applied metal layers was only successful previously through adequate roughening of the fluoropolymer. The bond mechanism in this case is generally understood in the sense of a "clawing" of the metal layer in the basic material.

Surprisingly, however, it was established that the desired flat surfaces can be coated securely if, instead of the noble metal layers, a first metal layer containing nickel was formed according to the invention on the fluoropolymer surfaces by decomposing volatile nickel compounds through a glow discharge process, and subsequently a second metal layer was deposited on the nickel layer from a metallisation bath. The polymer/metal bond had in this case excellent adhesive strength, the properties of the metal layers produced also being very good for high frequency applications in the GHz range. Of course, strongly bonded metal layers can also be produced by means of the method according to the invention on fluoropolymers which have been severely roughened by previous cleaning and etching processes. In contrast to the known methods, this roughening, however, is not an absolute requirement for sufficient adhesive strength of the metal layers on the polymer and is moreover disadvantageous for the electroconductive properties of metallised fluoropolymers in the highest frequency applications.

As well as polytetrafluoroethylene, other fluoropolymers can also be used which have a low dielectric constant, for example polychlortrifluoroethylene ($\epsilon$=2.36 at $10^8$ Hz, 25° C.), or fluorinated polyethylene propylene ($\epsilon$=2.0 at $10^2$ to $10^6$ Hz, 25° C.).

In order to form metal layers which are as pure as possible during the carrying out of the glow discharge process, the layers are after-treated after their formation preferably also under the effect of a glow discharge: first of all the metal layer is post-oxidised in an atmosphere containing oxygen. During the deposition process, carbon compounds which get into the layer during the deposition process through the incomplete decomposition of volatile nickel compounds containing carbon, are converted into carbon oxide compounds, for example carbon dioxide, and thus these compounds are driven out of the layer. In order to convert nickel oxide produced in this process into nickel again, the metal layers are then reduced in an atmosphere containing hydrogen.

The second metal layer is preferably deposited by means of an electroless method. In another embodiment, the second metal layer can in fact also be formed by electrolytic metal deposition. To this end, however, thicker first metal layers have to be produced in the glow discharge process, since electrolytic coating is only possible on a sufficiently electrically conductive metal layer.

As second metal layer, preferably again a nickel layer or an alloy layer of nickel with boron or phosphorous is deposited. Naturally, other metals can also be deposited, for example instead of nickel, also copper, cobalt, gold, palladium, platinum, tin, lead as well as alloys of these metals with one another or with other elements.

Before the metal deposition, the substrates are preferably pre-treated. For example they can be cleaned and etched in a glow discharge process. To this end the fluoropolymer laminate is brought into the plasma reactor, for example a parallel plate reactor, and placed between the electrodes. Then the reactor space is evacuated and an etching gas is introduced for cleaning and etching. As a cleaning and etching gas, an oxygen/tetrafluoromethane mixture can be used for example. Alternatively, pure noble gas atmospheres or oxygen can also be used. The pressure of the etching gas in the reactor space is set at least 10 Pa. For reasons of practicability, the upper limit proves to be roughly 1500 Pa, preferably roughly 300 Pa. For cleaning and etching, the glow discharge is then ignited for example by high frequency discharge (13.56 MHz). The capacity of the high frequency generator is set for example at 0.5 watt/cm$^2$ substrate surface. The temperature of the substrate is generally above room temperature and is for example roughly 100° C. The pre-treatment time is between roughly 0.1 and 30 minutes, preferably between roughly 6 and 10 minutes.

The pre-treatment conditions are so set, that as smooth a substrate surface as possible is obtained. The average peak-to-valley height $R_a$ of the fluoropolymer by surfaces should, after carrying out the pre-treatment with the glow discharge method be, averaged over 1 $\mu m^2$, at the most 100 nm, preferably 20 nm at the most. The to average peak-to-valley height $R_a$ is obtained for this purpose according to the method of a German standard (DIN 4762/1E, ISO/DIS 4287/1).

In order to obtain smooth surfaces of this kind, the etching gas, during its action on the surfaces, is adjusted to a pressure of at least 20 Pa, preferably at least 50 Pa. Furthermore, it has surprisingly emerged that, with an oxygen/tetrafluoromethane mixture, very smooth surfaces can be obtained. Under these conditions, the peak-to-valley height $R_a$ does not rise during the etching process, but sinks even. This guarantees that the surface properties of the dielectric material which are suitable for high frequency applications are not lost during the etching process.

On the conclusion of the cleaning and etching process, the reactor is evacuated again. Then metal is deposited on the dielectric surfaces. For this purpose, the volatile nickel compound is introduced with a carrier gas into the reactor space. Organic nickel compounds are preferably used as the volatile nickel compounds, for example π-allyl-π-cyclopentadienyl-nickel, bis-(π-methylcyclopentadienyl)-nickel, bis-(π-dimethylcyclopentadienyl)-nickel, bis-(π-pentamethylcyclopentadienyl)-nickel, π-methylcyclopentadienyl-π-cyclopentadienyl-nickel and bis-(π-cyclopentadienyl)-nickel. In addition, nickel tetracarbonyl and bis-(triphenylphosphine)-dicarbonyl-nickel can be used. However, the last-mentioned compounds are particularly toxic and are thus less suitable. Hydrogen, argon and mixtures of these gases can be considered as carrier gases.

For nickel deposition, a pressure of between roughly 10 Pa and roughly 1500 Pa, preferably of between roughly 50 and roughly 300 Pa is set in the reactor space. During the metal deposition, a gas stream of the volatile compound is led constantly in the carrier gas stream over the substrate surface. For this purpose, the carrier gas stream is led through a reservoir for the nickel compound disposed externally of the reactor, such that the nickel compound is vaporised and transferred by this means into the gas stream. For deposition, the glow discharge is ignited between the reactor electrodes. A high-frequency discharge is again preferably formed (e.g. 13.56 MHz). The capacity of the high-frequency generator is set for example at values of between roughly 0.1 and roughly 0.3 watt/cm$^2$ substrate surface. The temperature of the substrate is generally set at values above room temperature, for examples at values around 100° C. The deposition time depends on the desired nickel layer thickness. Usually, a coating time of between roughly 0.2 and roughly 15 minutes, and preferably of between roughly 1 and roughly 8 minutes, is set. The thickness of the nickel layer obtained is roughly 5 to roughly 500 nm.

Once the nickel layer has been formed, an after-treatment cycle is preferably then undergone, by means of which the layer formed containing nickel is first postoxidised and then reduced. For this purpose, oxygen is introduced after evacuation of the reactor chamber. For oxidation of the carbon species in the layer, the glow discharge is again ignited. Thereafter, hydrogen is introduced into the reactor space and the nickel oxides formed are reduced in the glow discharge to metallic nickel.

Additional metal layers can then be applied by means of conventional electroplating methods to the first metal layer formed. Preferably, nickel is deposited from an electroless bath. Suitable baths are, for example, nickel-plating baths with hypophosphorous acid or its salts and baths with boranes as the reducing agent.

The following electroless nickel baths are used by preference for the layer formation:

1. Electroless nickel bath with hypophosphite as the reducing agent for producing nickel/phosphorus layers:

| | |
|---|---|
| Nickel sulphate (NiSO$_4$(5H$_2$O) | 25 to 30 g/l |
| Sodium hypophosphite (NaH$_2$PO$_2$(H$_2$O) | 30 g/l |
| Citric acid | 2 g/l |
| Ethanoic acid | 5 g/l |
| Aminoethanoic acid | 10 g/l |
| Lead (as lead acetate) | 2 mg/l |
| pH value | 6.2 |
| Temperature | 80 to 84° C. |

The nickel/phosphorous layer obtained contains 4% by wt. phosphorous. Instead of nickel salts, cobalt salts can also be used to deposit cobalt/phosphorous layers or a mixture of nickel salts with cobalt salts to deposit nickel/cobalt/phosphorous layers.

2. Electroless nickel baths with dimethylaminoborane as the reducing agent to produce nickel/boron layers:

| | | |
|---|---|---|
| 2a. | Nickel sulphate (NiSO$_4$(5H$_2$O) | 25 g/l |
| | Dimethylaminoborane | 4 g/l |
| | Sodium succinate | 25 g/l |
| | Sodium sulphate | 15 g/l |
| | pH value | 5.0 |
| | Temperature | 60° C. |
| 2b. | Nickel sulphate (NiSO$_4$(5H$_2$O) | 40 g/l |
| | Dimethylaminoborane | 1–6 g/l |
| | Sodium citrate | 20 g/l |
| | Lactic acid (85 wt-%) | 10 g/l |
| | pH value | 7.0 |
| | Temperature | 40° C. |
| 2c. | Nickel sulphate (NiSO$_4$(5H$_2$O) | 50 g/l |
| | Dimethylaminoborane | 2.5 g/l |
| | Sodium citrate | 25 g/l |
| | Lactic acid (85 wt-%) | 25 g/l |
| | Thiodiglycolic acid | 1.5 mg/l |
| | pH value | 6 to 7 |
| | Temperature | 40° C. |

Baths with nickel chloride or nickel acetate instead of nickel sulphate can also be used. Diethylaminoborane is also suitable as the reducing agent instead of dimethylaminoborane.

Instead of nickel, cobalt, copper or other metals can also be deposited in the conventional manner. In an additional method variant, an electrolytically deposited layer can also be formed instead of a layer produced by an electroless method. Conventional deposition methods are also used to this end, preferably for nickel. Additional metal layers can be deposited on the second metal layer from electroless or electrolytic metallisation baths.

The method described is suitable for forming conductor structures on the substrate surfaces. Different structure-forming process techniques can be used for this purpose. The conductor structures can, for example, be formed by an etching process by a suitable etch resist being applied to the metal layer obtained, for example a photoresist foil, a photoresist resin or a screen-printing varnish. After the structuring, necessary for photoresists, through exposure to light and developing, the exposed metal layer regions which are not to be allocated to the later conductor structures are removed by etching. Then the resist can be detached again from the circuit carrier formed. Another method variant consists in producing the conductor structures to be formed, before the metal layer formation, through applying and structuring resist layers. In this case, the metal structures are automatically produced during the metallisation. After the completion of the metallisation process, the resist layer is removed, such that only the conductor structures remain on the places not covered by resist. Naturally, combined techniques can also be used, for example the so-called semi-additive technique, in which a metal layer is first formed over the whole surface, to which layer a resist layer is then applied. After structuring of the resist layer by exposure and developing, additional metal layers are deposited on the exposed places. After the resist has been removed, the regions of the metal layer applied first which do not correspond to the conductor structures are removed by etching.

The method according to the invention is also suitable for forming plasma etching masks. These are applied, for example, to already manufactured circuit carriers, in order, with their aid, to be able subsequently to etch perforations into the substrate by means of a glow discharge process. The method for manufacturing these masks corresponds to the one for manufacturing conductor structures on circuit carriers. The perforations to be formed in the substrate material must also appear as perforations in the metal layer obtained, so that the plasma etching gas can reach through said perforations.

To finish a circuit carrier, a plurality of circuit carrier levels can be provided according to the above-mentioned method with conductor track structures on one or both sides. Then a plurality of these circuit carrier levels can be welded over their whole surface to one another (lamination process). Conductor track structures can again be, produced on the external surfaces of this packet. To connect a plurality of conductor track levels in the stack, first of all perforations are formed which cut into the individual metal structures in the individual layers. To this end, for example, suitable metal masks are formed according to the above-mentioned method on the outer sides of the stack, and perforations are etched into the substrate through the perforations contained in these masks, for example in a glow discharge. Later, the perforation walls produced can be coated with metal by electroplating methods in order to connect the individual levels electrically with one another.

Active and passive components can now be fitted mechanically and electrically to the outer sides of the circuit carriers formed in this way.

The invention is explained in greater detail with the aid of the following examples:

EXAMPLE 1

| | |
|---|---|
| Substrate material: | Teflon ®FEP (Company: DuPont de Nemours, Inc. USA), (size 40 cm × 40 cm × 50 μm) |
| Reactor: | parallel plate reactor |
| Frequency: | 13.56 MHz |
| 1. Pre-treatment: | |
| Gas: | oxygen (100 sccm[1])/tetra-fluoromethane (40 sccm) |
| Electrode temperature: | 25° C. |
| Pressure in reactor: | 160 Pa |
| Power density: | 0.63 watt/cm$^2$ |
| Treatment time: | 8 min |
| 2. Deposition: | |
| Carrier gas: | argon(155 sccm)/hydrogen (300 sccm) |
| Organometallic compound: | π-allyl-π-cyclo-pentadienyl-nickel |
| Temperature of storage container: | 65° C. |
| Electrode temperature: | 80° C. |
| Pressure in reactor: | 160 Pa |
| Power density: | 0.26 watt/cm$^2$ |
| Coating time: | 10 min |
| 3. Oxidation: | |
| Gas: | oxygen (100 sccm) |
| Electrode temperature: | 80° C. |
| Pressure in reactor: | 160 Pa |
| Power density | 0.63 watt/cm$^2$ |
| Treatment time: | 4 min |
| 4. Reduction: | |
| Gas: | hydrogen (100 sccm) |
| Electrode temperature: | 80° C. |
| Pressure in reactor: | 160 Pa |
| Power density: | 1.26 watt/cm$^2$ |
| Treatment time: | 6 min |

[1]sccm: Standard cm$^2$ (gas flow, measured at 25° C.)

The Teflon® foil was laid on the lower electrode of a parallel plate reactor. The reactor was evacuated to the pressure quoted and the plasma ignited. After the pre-treatment, the nickel compound was passed through with carrier gas in a vaporiser at reactor chamber pressure, united with the hydrogen stream immediately before entering the reactor chamber, and introduced into the glow discharge zone. Within 10 minutes, a nonporous film containing nickel and between 10 and 50 nm thick formed on the smooth Teflon® surface. The film was then oxidised again under the conditions quoted above and thereafter reduced.

The film obtained was strengthened in an electroless nickel bath of the following composition:

| | |
|---|---|
| Nickel sulphate ($NiSO_4(6H_2O)$) | 20 g/l |
| Dimethylaminoborane | 2 to 3 g/l |
| Sodium sulphate | 2 g/l |
| Lactic acid (90 wt-%) | 20 g/l |
| pH value | 5.3 to 5.6 | at a bath temperature of 55° C. and then electrolytically copper-plated. Thereafter conductor tracks were formed from the obtained metal layer by means of structuring methods known from printed circuit board technology.

EXAMPLE 2

| | |
|---|---|
| Substrate material: | Teflon ®FEP (Company: DuPont de Nemours, Inc. USA), (size 40 cm × 40 cm × 50 µm) |
| Reactor: | parallel plate reactor |
| Frequency: | 13.56 MHz |
| 1. pre-treatment: | |
| Gas: | oxygen (100 sccm)/tetra-fluoromethane (40 sccm) |
| Electrode temperature: | 25° C. |
| Pressure in reactor: | 160 Pa |
| Power density: | 0.63 watt/cm$^2$ |
| Coating time: | 8 min |
| 2. Deposition: | |
| Carrier gas: | hydrogen(100 sccm)/argon (50 sccm) |
| Organometallic compound: | neckel tetracarbonyl (50 sccm) |
| Temperature of storage container: | 25° C. |
| Electrode temperature: | 25° C. |
| Pressure in reactor: | 160 Pa |
| Power density: | 0.13 watt/cm$^2$ |
| Coating time: | 10 min |

A Teflon® foil was laid on the lower electrode of the reactor. The reactor was evacuated to the quoted pressure and the plasma then ignited for the pre-treatment. Then the pre-treatment gas was removed from the reactor chamber again, thereafter the carrier gas atmosphere for the subsequent metal deposition was introduced up to the desired pressure and the plasma ignited anew. The nickel compound was passed through with carrier gas into a receiving flask at normal pressure and introduced into the glow discharge zone via a throttle. Within 10 min a nonporous film containing nickel and between 30 and 100 nm thick was deposited with a strong bond on the smooth sample surface.

Thereafter the Teflon® foil was removed from the reactor and a photoresist applied to he metal layer. The resist layer was structured with a pattern according to conventional methods by exposure to light and developing. Thereafter the regions exposed by the resist were etched, such that the metal layer was removed in these regions. Then the resist layer was removed again.

EXAMPLE 3

| | |
|---|---|
| Substrate material: | Teflon ®FEP (Company: DuPont de Nemours, Inc. USA), (size 40 cm × 40 cm × 50 µm) |
| Reactor: | parallel plate reactor |
| Frequency: | 13.56 MHz |
| 1. Pre-treatment: | |
| Gas: | oxygen (100 sccm)/tetra-fluoromethane (40 sccm) |
| Electrode temperature: | 100° C. |
| Pressure in reactor: | 160 Pa |
| Power density: | 0.63 watt/cm$^2$ |
| Treatment time: | 8 min |
| 2. Deposition: | |
| Carrier gas: | hydrogen (100 sccm)/argon (15 sccm) |
| Organometallic compound: | bis-(π-cyclo-pentadienyl) nickel (25 mg/min) |
| Temperature of storage container: | 90° C. |
| Electrode temperature: | 100° C. |
| Pressure in reactor: | 160 Pa |
| Power density: | 0.26 watt/cm$^2$ |
| Coating time: | 4 min |
| 3. Oxidation: | |
| Gas: | oxygen (100 sccm) |
| Electrode temperature: | 100° C. |
| Pressure in reactor: | 160 Pa |
| Power density: | 0.63 watt/cm$^2$ |
| Treatment time: | 4 min |
| 4. Reduction: | |
| Gas: | hydrogen (100 sccm) |
| Electrode temperature: | 100° C. |
| Pressure in reactor: | 160 Pa |
| Power density: | 1.26 watt/cm$^2$ |
| Treatment time: | 6 min |

A Teflon® foil was laid on the lower electrode of the reactor. The reactor was evacuated to the pressure quoted and the plasma ignited for pre-treatment. For the subsequent metal deposition, the nickel compound was passed through with argon as the carrier gas in a vaporiser at reactor chamber pressure, united with the hydrogen stream immediately before entering the reactor chamber, and introduced into the glow discharge zone. A film containing nickel and between 10 and 50 nm thick was deposited on the sample surface and was then oxidised under the above-mentioned conditions and reduced.

Thereafter the film obtained was strengthened in a commercially available electroless nickel bath and then electrolytically copper-plated. To form conductor track structures, known structuring methods were used.

EXAMPLE 4

The following basic materials were coated:
4A) Novoflon, FEP foil (Company: Nowofol Kunststoff-produkte GmbH & Co. KG, Siegsdorf, DE). 50 µm thick, transparent
4B) Teflon® FEP, 50 µm thick
4C) PTFE foil (Company: Norton Pampus GmbH, Willich, DE) 50 µm thick
4D) PTFE foil (Company: Norton Pampus GmbH, Willich, DE), etched on one side, 50 µm thick In each case the foils were 40 cm×40 cm large. They were subjected without additional pre-treatment to the following four-stage plasma process (Table 1).

The polymer substrate used is in each case either unlaminated or laminated polymer foil (carrier: copper-clad FR4 epoxy core of roughly 1 mm thickness). The pre-treatment of the polymer (Step 1) served to etch the polymer surfaces. In an 8-minute long etching treatment in the glow discharge, the surfaces were pared by several μm. In this process, the average peak-to-valley height ($R_a$) of the surface was reduced. This was proved by AFM (atomic force microscopy) measurements (Table 2). For this purpose, the sample was scanned with a very fine point and the height excursion measured as a function of the respective place of the point according to DIN 4768/1) ($R_a$: average peak-to-valley height in [nanometres]).

The metal deposition led to a film with a high proportion of nickel on the polymer surfaces (Stage 2). In two subsequent process steps, this film was first oxidised (Stage 3) and then reduced (Stage 4). Catalytically active nickel species were produced on the polymer surface, and these led, in an electroless nickel bath with borane compounds as the reducing agent, to the homogeneous deposition of a metallic nickel/boron film (bath temperature: 50° C.)

The metallic nickel layer had a thickness of roughly (200–100) nm. The substrate was then tempered for 24 hours at 100° C. Thereafter a 15–20 μm thick copper layer was applied electrolytically.

Directly after the electrolytic deposition, the adhesive strength of the metal layer was measured. The adhesion in the peeling test was in experiments 4A) and 4B) respectively above 10 N/cm without any additional tempering steps being necessary.

TABLE 1

Four-stage plasma process

| Process step | Stage 1 | Stage 2 | Stage 3 | Stage 4 |
|---|---|---|---|---|
| | Substrate pre-treatment | Metal deposition | Oxidation of layer | Reduction of layer |
| Gas | O2/CF4 | H$_2$/Ar | O2 | H2 |
| Gas flow [sccm/min][1]) | 100 (O$_2$) 40 (CF$_4$) | 100 (H$_2$) 15 (Ar through vaporiser) | 100 | 100 |
| Amount of Ni compound [mg/cycle] | — | 200 (~5 sccm/min)[1]) | — | — |
| Power [watt] | 1000 | 300 | 1000 | 2000 |
| Pressure [Pa] | 160 | 160 | 160 | 160 |
| Treatment time [min] | 8 | 4 | 4 | 6 |
| Temperature [° C.] | | | | |
| Vaporiser: | 90 | 90 | 90 | 90 |
| Supply line: | 110 | 110 | 110 | 110 |
| Chamber | 100 | 100 | 100 | 100 |

[1])sccm: Standard cm3 (gas flow, measured at 25(C)

TABLE 2

Peak-to-valley height of the PTFE foil (Sample 4C) with the CF$_4$ treatment

| Pre-treatment [min] | $R_a$[1]) [nm] |
|---|---|
| 0 | 4.7 |
| 2 | 4.5 |

TABLE 2-continued

Peak-to-valley height of the PTFE foil (Sample 4C) with the CF$_4$ treatment

| Pre-treatment [min] | $R_a$[1]) [nm] |
|---|---|
| 4 | 3.0 |
| 8 | 1.7 |

[1])$R_a$ in [nm] averaged over 1 μm$^2$, calculated in each case in accordance with the method according to DIN 4762/1E//ISO/DIS 4287/1

What is claimed is:

1. Method of manufacturing metallised substrate materials which are suitable for the manufacture of electrical circuit carriers which may be used in the gigahertz range, in which substrates having fluoropolymer surfaces are securely coated with metal layers by:

a. pretreating the fluoropolymer surfaces with a slow discharge process in the presence of an etching gas in such a manner that the averag peak-to-valley height $R_a$ of the fluoropolymer surfaces after carrying out the pre-treatment with the glow discharge process is at the most 20 nm, averaged over 1 μm$^2$, b. depositing a first metal layer containing nickel on the fluoropolymer surfaces by the decomposition of volatile nickel compounds by means of a glow discharge process, and c. depositing a second metal layer on the first metal layer from a metallisation bath.

2. Method according to claim 1, characterised in that the first metal layer is subsequently treated in the following process steps:

b1. treatment of the first metal layer in an atmosphere containing oxygen by means of a glow discharge process, b2. treatment of the first metal layer in an atmosphere containing hydrogen by means of a glow discharge process.

3. Method according to one of the preceding claims, characterised in that the second metal layer is deposited by means of an electroless method.

4. Method according to claim 3, characterised in that a nickel layer or an alloy layer composed of nickel with boron or phosphorous is deposited as the second metal layer.

5. Method according to one of the preceding claims 1 and 2, characterised in that organic nickel compounds are used as the volatile nickel compounds.

6. Method according to one of the preceding claims 1 to 2, characterised in that the etching gas, during its action on the surfaces, is adjusted to a pressure of at least 20 Pa.

7. Method according to one of the preceding claims 1 to 2, characterised in that the fluoropolymer surfaces are pretreated in the presence of an oxygen/tetrafluoromethane gas mixture as the etching gas.

8. Application of the method according to one of the preceding claims 1 and 2, for forming conductor structures on the fluoropolymer surfaces by structuring of the obtained metal layers with suitable etch resists and subsequent etching away of the metal layer regions not forming the conductor structures, or by structuring of the fluoropolymer surfaces with suitable resists and subsequent deposition of metal layers in the regions of the fluoropolymer surfaces forming the conductor structures.

9. Application of the method according to one of claims 1 to 2 for forming a mask for plasma etching in the fluoropolymer surfaces by structuring of the obtained metal surfaces with suitable etch resists and subsequent etching away of the metal layer regions not forming the mask, or by structuring of the fluoropolymer surfaces with suitable resists and subsequent deposition of metal layers in the regions of the fluoropolymer surfaces forming the mask.

* * * * *

UNITED STATES PATENT AND TRADEMARK OFFICE
CERTIFICATE OF CORRECTION

PATENT NO.    : 6,706,201 B1
DATED         : March 16, 2004
INVENTOR(S)   : Heinrich Meyer et al.

It is certified that error appears in the above-identified patent and that said Letters Patent is hereby corrected as shown below:

Column 12,
Line 19, delete "slow" and substitute -- glow --.

Signed and Sealed this

First Day of March, 2005

JON W. DUDAS
*Director of the United States Patent and Trademark Office*